United States Patent
Okazaki

(10) Patent No.: US 7,414,470 B2
(45) Date of Patent: Aug. 19, 2008

(54) PREDISTORTION AMPLIFIER FOR COMPENSATION DISTORTION

(75) Inventor: Takashi Okazaki, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 97 days.

(21) Appl. No.: 11/481,807

(22) Filed: Jul. 7, 2006

(65) Prior Publication Data

US 2007/0008033 A1    Jan. 11, 2007

(30) Foreign Application Priority Data

Jul. 7, 2005    (JP) .............................. 2005-198349

(51) Int. Cl.
    H03F 1/26    (2006.01)
(52) U.S. Cl. ........................................ 330/149
(58) Field of Classification Search ................ 330/136, 330/149; 375/296, 297; 455/114.3, 63.1
    See application file for complete search history.

(56) References Cited

U.S. PATENT DOCUMENTS

| 6,646,506 | B1 | 11/2003 | Hofmann et al. ............ 330/149 |
| 6,925,106 | B2 * | 8/2005 | Horaguchi et al. .......... 375/296 |
| 7,259,630 | B2 * | 8/2007 | Bachman et al. ............ 330/149 |
| 2002/0101937 | A1 | 8/2002 | Antonio et al. ............. 375/297 |

FOREIGN PATENT DOCUMENTS

| EP | 1011192 | 6/2000 |
| EP | 1107449 | 6/2001 |

* cited by examiner

*Primary Examiner*—Khanh V Nguyen
(74) *Attorney, Agent, or Firm*—Bacon & Thomas, PLLC

(57) ABSTRACT

A predistortion amplifier for compensating distortion includes an amplifying unit; a power detection unit; a distortion compensation table; a control unit; and a predistortion unit for generating a predistorted signal to be inputted to the amplifying device by performing a predistortion on the amplitude and a phase of the input signal, the predistortion being performed by using the compensation values corresponding to the input level outputted from the power detection unit stored in the distortion compensation table. The predistortion unit includes an offset adder for adding an offset value to an amplitude compensating value, the amplitude compensating value being assigned to the amplitude of the input signal by the compensation values based on the input level, and the offset value being determined regardless of the input level. Further, the control unit includes an offset generator for generating the offset value.

5 Claims, 5 Drawing Sheets

AM/AM CHARACTERISTIC

AM/PM CHARACTERISTIC

PREDISTORTION AMPLIFIER FOR COMPENSATION DISTORTION

FIELD OF THE INVENTION

The present invention relates to a predistortion amplifier for compensating distortion; and, more particularly, to a predistortion amplifier for compensating distortion capable of stabilizing an output level of the amplifying unit.

BACKGROUND OF THE INVENTION

In a base station apparatus in a mobile communications system using, e.g., a W-CDMA (Wideband Code Division Multiple Access) scheme as a mobile communications scheme, signals need to be greatly amplified by an amplifier to be delivered as wireless signals to a distant place where a mobile station apparatus is installed. However, since the amplifier is an analogue device, input and output characteristics thereof behave nonlinearly. Specifically, beyond an amplification limit referred to as "saturation point," an output power remains constant even if an electric power inputted to the amplifier is increased. Further, this nonlinear output characteristic gives rise to a nonlinear distortion. In a signal to be sent, signal components outside of a desired signal frequency range are suppressed to a low level before the amplification. However, after passing through the amplifier, the signal to be sent is nonlinearly distorted, so that some signal components therein are leaked out of the desired signal frequency range into adjacent channels. Since the output power of the signal to be sent is high in, for example, a base station apparatus as described above, the leakage power into the adjacent channels is regulated strictly. Therefore, it is an important technical problem how to reduce the adjacent power leakage power.

As a technique for compensating the distortion caused by the nonlinear characteristics of the amplifier and enlarging an operation range of the amplifier, a predistortion method for compensating the distortion is widely used. FIG. 2 illustrates a block diagram depicting a schematic configuration of a conventional amplifier using the predistortion method for compensating the distortion. A power detection unit 201 detects an electric power or an amplitude of an input signal $S_{IN}$ or a value of a logarithm thereof. In the following, "input level L" refers to an instantaneous value (in a baseband range) or an envelope-(after the signal is modulated by a carrier) of the detected power or amplitude. A distortion compensation table 202 stores compensation values M corresponding to the input level L at corresponding addresses, and outputs a compensation value M corresponding to a specific input level to a predistortion unit 203. The predistortion unit 203 performs a predistortion on the input signal $S_{IN}$ by using the compensation value M, and outputs a predistorted signal to an amplifying unit 204. Then, the amplifying unit 204 amplifies the predistorted signal, and outputs the amplified signal as an output signal $S_{OUT}$. Herein, if the predistortion performed on the input signal $S_{IN}$ by using the compensation value M has a characteristic opposite to that of the nonlinear distortion in the amplifying unit 204, the output signal $S_{OUT}$ becomes equivalent to a signal obtained by amplifying the input signal $S_{IN}$ by a linear circuit, so that the nonlinear distortion in the amplifying unit is compensated.

Further, if a temperature or a source voltage changes, the input and output characteristics of the amplifying unit 204 change, and thus the nonlinear characteristics thereof also change. A control unit 205 monitors the output signal, and updates the compensation values if the characteristics of the amplifying unit change, thereby updating the distortion compensation table.

FIG. 2 depicts schematic configuration of a conventional amplifier using the predistortion method for compensating the distortion. In case where the base station apparatus employs an orthogonal modulation such as 16 QAM (Quadrature amplitude Modulation), the input signal $S_{IN}$ includes an I (In-phase) signal and a Q (Quadrature) signal in the baseband, the distortion compensation table 202 and the control unit 205 are configured as digital circuits, and the amplifying unit 204 is operated in a wireless frequency range. Further, the I and Q signals in the baseband are converted into wireless signals by a D/A converter, an orthogonal modulator, and a frequency converter and the like that are not shown in FIG. 2, and then inputted into the amplifying unit 204. The predistortion unit 203 includes a processing circuit for processing the I and Q signals in the baseband or compensation circuit for compensating an amplitude and a phase of an analog signal after the orthogonal modulation. Further, if necessary, a frequency converter, an orthogonal demodulator, a D/A converter and the like may be installed between an output terminal of the amplifying unit 204 and the control unit 205.

As prior arts, References 1 to 3 disclose the predistortion method for compensating distortions described above. Among these, Reference 1 discloses a "distortion compensation circuit and method," proposing a technique for updating the distortion compensation table quickly and easily when adaptive information such as temperature, source voltage and frequency is changed. Reference 2 discloses a "transmitter" for performing the distortion compensation more precisely by using a DC offset generated in a D/A converter and an orthogonal modulator for converting the baseband I and Q signals into wireless signals. Further, Reference 3 discloses a "radio equipment and distortion compensation method" for performing the distortion compensation more precisely by using a DC offset generated in an orthogonal modulator.

Reference 1: Japanese Patent Laid-Open Application No. 2002-26998

Reference 2: Japanese Patent Laid-Open Application No. 2001-237723

Reference 3: Japanese Patent Laid-Open Application No. H10-65570

Since the characteristics of the amplifying unit change as the temperature thereabout, the source voltage and the like change, the distortion compensation table has to be updated in response to the change in the environmental conditions. As an updating method for updating the distortion compensation table, there is widely used a perturbation method, in which signal components outside of the desired signal frequency range in the output signal of the amplifying unit are monitored, and if any of them exceeds a preset level, the distortion compensation values are minutely changed in a manner to reduce the signal components outside of the desired signal frequency range. However, if the distortion compensation table is updated by using this method, an average power of the amplifying unit output is sometimes changed by the predistortion reflecting the updated results, thus causing an undesirable effect to a transmission apparatus.

SUMMARY OF THE INVENTION

It is, therefore, an object of the present invention to provide predistortion amplifier or compensating distortions capable of performing a predistortion without causing a change in the average power of the amplifying unit output.

In accordance with the present invention, there is provided A predistortion amplifier for compensating distortion, includes an amplifying unit; a power detection unit for detecting an electric power or amplitude of an input signal to output an input level; a distortion compensation table for storing compensation values corresponding to the input level, the compensation values being used for compensating nonlinear characteristics of the amplifying unit; a control unit for updating the compensation values so that signal components outside of a desired frequency range that are included in an output signal of the amplifying unit do not exceed a preset level; a predistortion unit for generating a predistorted signal to be inputted to the amplifying device by performing a predistortion on the amplitude and a phase of the input signal, the predistortion being performed by using the compensation values corresponding to the input level outputted from the power detection unit stored in the distortion compensation table, wherein the predistortion unit includes an offset adder for adding an offset value to an amplitude compensating value, the amplitude compensating value being assigned to the amplitude of the input signal by the compensation values based on the input level, and the offset value being determined regardless of the input level, and wherein the control unit includes an offset generator for calculating an average value of the amplitude compensating value for each input level when the compensation values are updated, thereby generating the offset value by inverting a sign of the average value.

In accordance with the present invention, there is provided A predistortion amplifier for compensating distortion, includes an amplifying unit; a power detection unit for detecting an electric power or an amplitude of an input signal or a logarithm of the electric power or the amplitude thereof, thereby outputting an input level; a distortion compensation table for storing a complex compensation value corresponding to the input level, the complex compensation value being used for compensating nonlinear characteristics of the amplifying unit; a control unit for updating the complex compensation value so that signal components outside of a desired frequency range that are included in an output signal of the amplifying unit do not exceed a preset level; a predistortion unit for generating a predistorted signal to be inputted to the amplifying device by multiplying the input signal with the complex compensation value corresponding to the input level outputted from the power detection unit stored in the distortion compensation table, and then performing a predistortion on the amplitude and a phase of the input signal, wherein the predistortion unit includes an offset adder for adding an offset value to an amplitude compensating value, the amplitude compensating value being assigned to the amplitude of the input signal by the complex compensation value based on the input level, and the offset value being determined regardless of the input level; a counter for counting the number of occurrences of each input level for a preset amount of time; and an offset generator for calculating a weighted average value of the amplitude compensating value for each input level when the compensation values are updated to generate the offset value by inverting a sign of the weighted average value, each weight of the weighted average value being the number of the occurrences of each input level counted by the counter.

In accordance with the present invention, there is provided a predistortion amplifier for compensating distortion, including an amplifying unit; a power detection unit for detecting an amplitude of an input signal to output an input level; a distortion compensation signal generation unit for generating a compensation signal based on the input level, the compensation signal being used for compensating nonlinear characteristics of the amplifying unit; a distortion compensation unit for performing a distortion compensation on the input signal by using the compensation signal to output a compensated signal to the amplifying unit; a control unit for controlling the distortion compensation signal generation unit to suppress a distortion in an output signal of the amplifying unit, wherein, in the distortion compensation signal generation unit, an amplitude component of the compensation signal is represented by a sum of a plurality of Taylor series including only odd or even power terms that allow the distortion compensation unit to mainly generate components of odd powers, each of the Taylor series being a finite polynomial function of the input level whose degree is 4 or higher computed about a plurality of central points in a range of the input level, and wherein the control unit controls coefficients of respective terms in the plurality of the Taylor series.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENT

Figure 3:
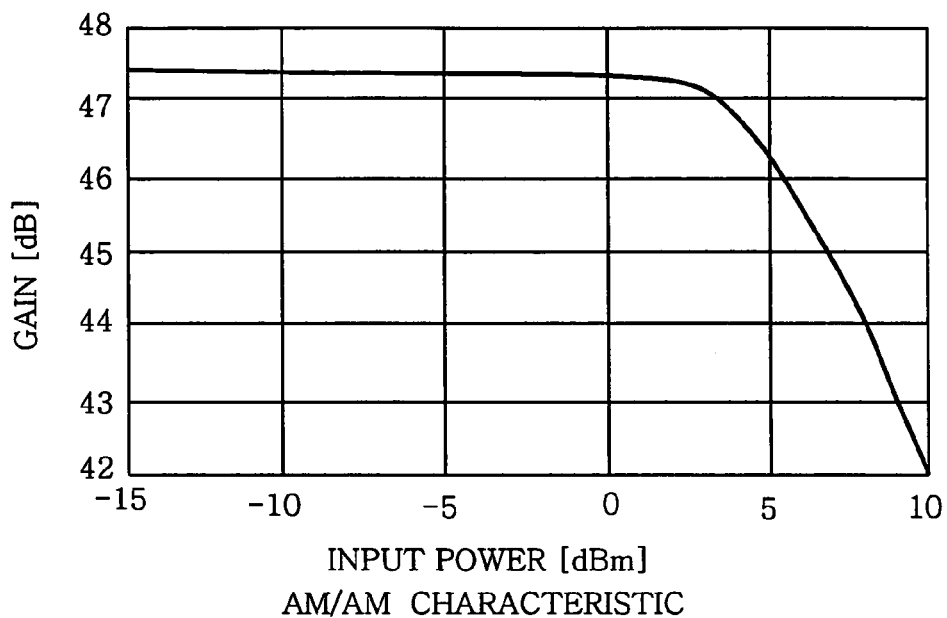
FIGS. 3 and 4 provide graphs for respectively depicting a magnitude and a phase of a gain of an amplifying unit depending on the input power.
Figure 4:
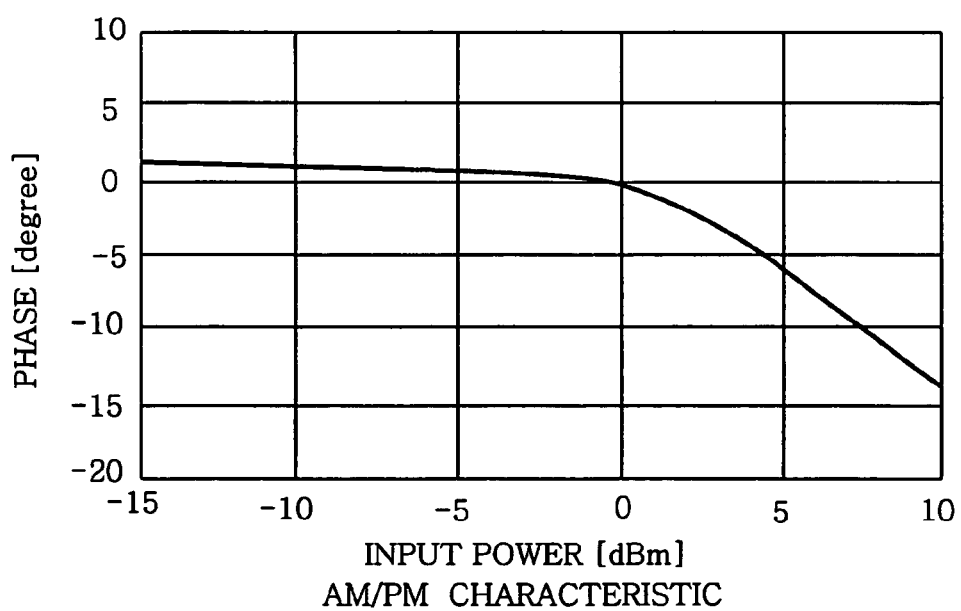

Hereinafter, preferred embodiments in accordance with the present invention will be described. FIGS. 3 and 4 provide graphs for respectively depicting a magnitude and a phase of a gain of the amplifying unit as functions of the input power. As shown in FIG. 3, the amplifying unit has nonlinear characteristics such that the gain is reduced as the input level is increased. Further, as shown in FIG. 4, the phase of the gain is also reduced as the input level is increased. Although not shown in FIGS. 3 and 4, if the amplifying unit is operated in class B or in class AB that is closer to class B, the amplifying unit shows the nonlinear characteristic, i.e., the reduction in the gain when the input level is smaller than a deviation of a bias level of the amplifying unit from a class-B level.

In the nonlinear characteristics described above, the distorted components in the desired signal frequency range and adjacent ranges thereof are caused by output components corresponding to odd powers, i.e., $3^{rd}$ power, $5^{th}$ power and so forth, of the input signal. Therefore, in accordance with the a first preferred embodiment, the distortions caused by output components corresponding to $3^{rd}$, $5^{th}$ and $7^{th}$ powers of the input signal are compensated by an amplitude compensation value MA and a phase compensation value MP obtained by Eqs. 1 to 3.

$$MA = MA_1 + MA_2;$$

$$MP = MP_1 + MP_2 \quad \text{Eq. 1}$$

$$MA_1 = L_{A3}x^2 + L_{A5}x^4 + L_{A7}x^6;$$

$$MA_2 = S_{A3}(1-2x)^2 + S_{A5}(1-2x)^4 + S_{A7}(1-2x)^6, \ x < 0.5 \ 0, \ x \geq 0.5 \quad \text{Eq. 2}$$

$$MP_1 = L_{P3}x^2 + L_{P5}x^4 + L_{P7}x^6;$$

$$MP_2 = S_{P3}(1-2x)^2 + S_{P5}(1-2x)^4 + S_{P7}(1-2x)^6, \ x < 0.5 \ 0, \ x \geq 0.5 \quad \text{Eq. 3}$$

In Eqs. 1 to 3, x is a normalized amplitude level L of the input signal, which ranges from 0 to 1. Coefficients $L_m$ and $S_{An}$ are amplitude compensation coefficients for compensating the distortions of $n^{th}$ powers, i.e., the distortions caused by output components corresponding to $n^{th}$ powers of the input signal, wherein n is 3, 5 or 7. The compensation values MA1 and MP1 are correction terms used for correcting the nonlinear characteristics when x is not in a vicinity of 0, and correspond to Taylor series expansion of the nonlinear characteristics about a central point x=0 (i.e., Maclaurin series expansion). Further, the compensation values MA2 and MP2 are correction terms used for correcting the nonlinear characteristics when x is close to 0, and correspond to Taylor expansion of the nonlinear characteristics about a central point x=0.5. The compensation values MA2 and MP2 are substituted by 0 when x is greater than 0.5, i.e., the central point of the Taylor series expansion corresponding thereto. In other words, since MA2, MP2 and first and higher derivatives thereof are equal to 0 at the central point x=0.5, MA2 and MP2 are set to be 0 at x>0.5. Thus, MA and MP as functions of x can be made twice differentiable or uniformly continuous in $0 \leq x \leq 1$ without influencing the range of x>0.5.

Since the predistortion unit performs operations equivalent to multiplications of the compensation values MA1, MP1, MA2 and MP2 by the input signal, the compensation values MA1, MP1, MA2 and MP2 include even power terms in order to generate distortions of odd powers. It should be noted that Eqs. 1 to 3 do not include constant terms representing baseband components, and that the Taylor series include only even power terms, but polynomial expansions thereof include odd power terms that can allow the distortions of even powers to be generated. Further, the degrees of terms of the Taylor series are halved if a power level is used in lieu of the amplitude level, because the power level is proportional to a square of the amplitude level. Thus, in this case, the Taylor series include odd power terms as well as even power terms.

If the predistortion unit performs the predistortion on an analog signal after the orthogonal modulation or a digital signal in a polar form, the compensation values MA and MP are computed by Eqs. 1 to 3 for each value of x to thereby be stored in the distortion compensation table, and the predistortion unit generates an input signal of the amplifying unit 104 by controlling an attenuator or a phase shifter by using the compensation values. Further, if the predistortion unit performs the predistortion on the baseband I and Q signals, the compensation values MA and MP are converted into a complex compensation value having mutually orthogonal components of I and Q as its real and imaginary parts, and the complex compensation value is stored in the distortion compensation table. In this case, the predistorted signal is obtained by multiplying the input signal by the complex compensation value and then adding the input signal thereto.

Figure 1:
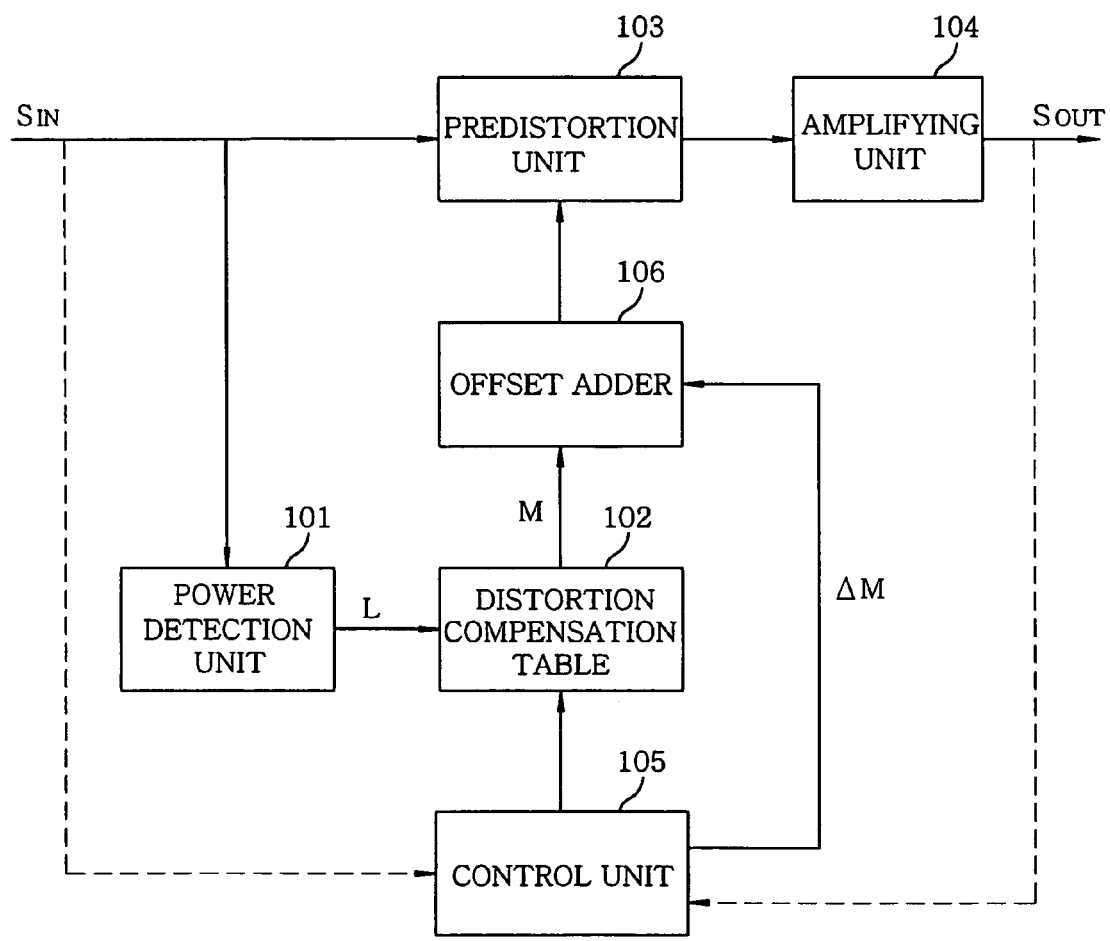
FIG. 1 shows a block diagram depicting a schematic configuration of an amplifier using the predistortion method for compensating the distortion in accordance with a first preferred embodiment of the present invention.
Figure 2:
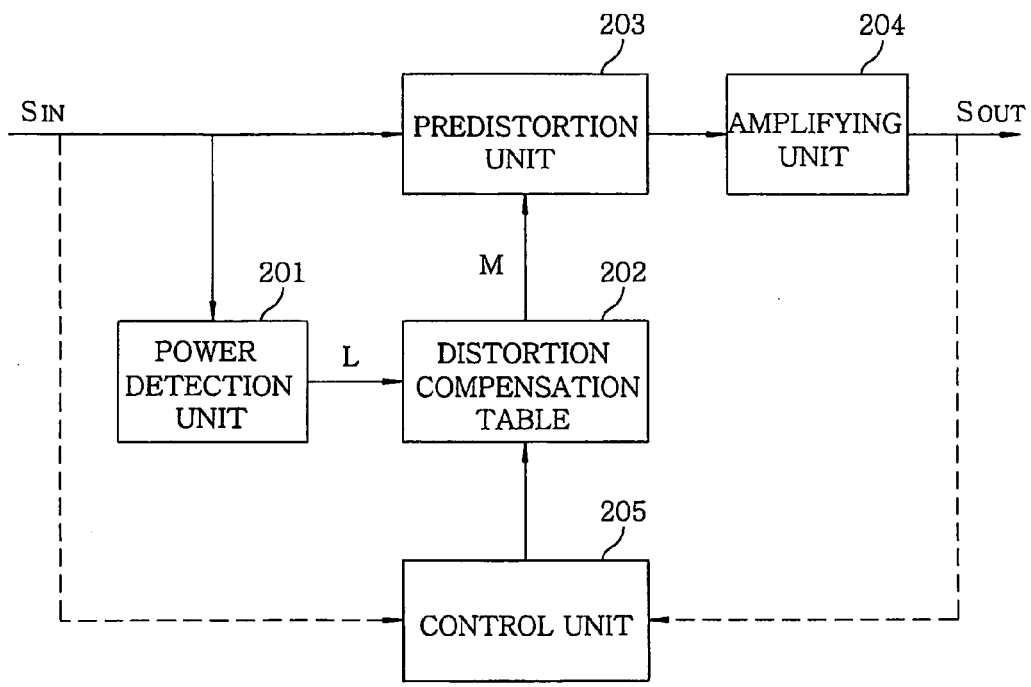
FIG. 2 illustrates a block diagram depicting a schematic configuration of a conventional amplifier using the predistortion method for compensating the distortion.

FIG. 1 shows a block diagram depicting a schematic configuration of an amplifier using the predistortion method for compensating the distortion in accordance with the first preferred embodiment of the present invention. In FIG. 1, functions of a power detection unit 101, a distortion compensation table 102, a predistortion unit 103 and an amplifying unit 104 are same as those shown in FIG. 2. Herein, a compensation value M (i.e., an amplitude compensation value MA and a phase compensation value MP) in the distortion compensation table 102 is obtained by using Eqs. 1 to 3. A control unit 105 performs operations same as those of the control unit 205, and in addition, generates an offset ΔM for stabilizing an average power of the output signal $S_{OUT}$. An offset adder 106 adds the offset ΔM to the amplitude compensation value MA stored in the distortion compensation table, and sends the result to the predistortion unit 103.

Figure 5:
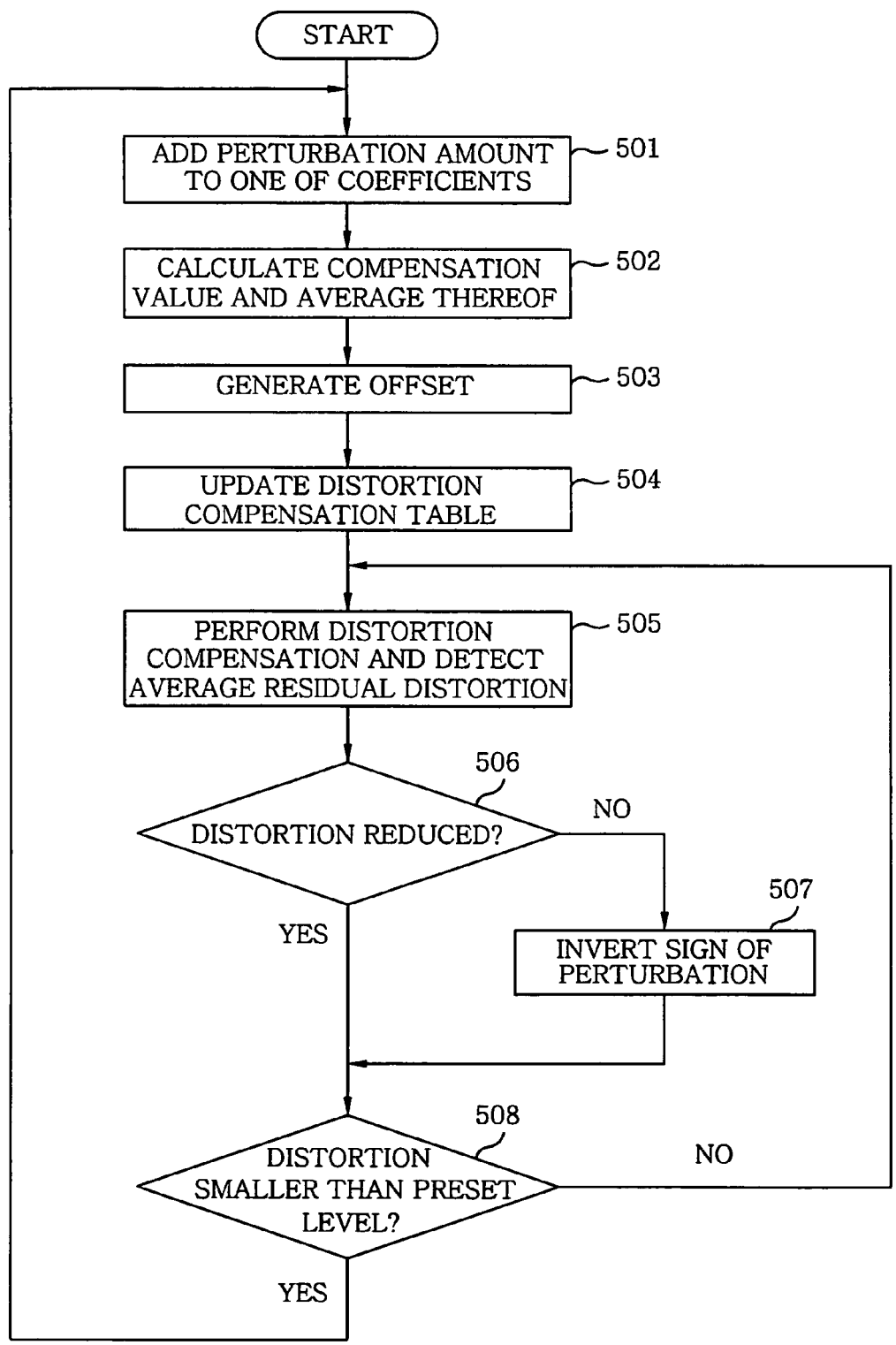
FIG. 5 offers a flow chart showing operations for generating an offset in accordance with a first preferred embodiment of the present invention.

FIG. 5 offers a flow chart showing operations of the control unit 105 for updating the distortion compensation table 102 and generating the offset ΔM in response to a change in the nonlinear characteristics of the amplifying unit 104. As shown therein, the distortion compensation table is updated by using the perturbation method as in the prior art. If the compensation values for compensating the distortion are obtained by using Eqs. 1 to 3, the distortion is reduced by trial and error method while respectively changing the amplitude compensation coefficients $L_{An}$ and $S_{An}$ and the phase compensation coefficients $L_{Pn}$ and $S_{Pn}$ by a preset amount in a preset order and detecting distortions, i.e., output signals outside of the desired signal frequency range. To perform this operation, the control unit stores amounts or at least signs of the perturbations to be applied to the respetive coeeficients, and an amount of a previously detected distorion.

In an operation 501, a perturbation amount is added to one of the coefficients. Thereafter, in an operation 502, the compensation value M corresponding to each address in the distortion compensation table 102 and the average of the amplitude compensation value MA are calculated. The average can be obtained by calculating a sum of the amplitude compensation values, or by computing definite integrals of Eqs. 2 and 3.

In a next operation 503, the offset ΔM is generated by inverting the sign of the average of the amplitude compensation value obtained in the operation 502. Then, in a next operation 504, thus obtained offset ΔM is inputted into the offset adder 106, and the compensation value M in the distortion compensation table 102 is updated. If the predistortion is performed on the baseband I and Q signals, instead of inputting the offset ΔM into the offset adder 106, the offset ΔM is added to the amplitude compensation value. Then, the amplitude compensation value MA plus the offset ΔM and the phase compensation value MP are converted into a complex compensation value, and the distortion compensation table 102 is updated by the complex compensation value.

Thereafter, in a next operation 505, the distortion compensation is performed by using the updated distortion compensation table, and an average residual distortion is detected. At this time, since the offset ΔM is added to the amplitude compensation value inputted to the offset adder 106 from the distortion compensation table 102, the average of the amplitude compensation value inputted to the predistortion unit 103 remains 0. Therefore, a change in the average of the amplifying unit input level caused by the distortion compensation also remains 0, so that a change in the level of the amplifying unit output signal $S_{OUT}$ can be suppressed. If the predistortion is performed on the baseband I and Q signals, the offset adder 106 processes the baseband I and Q signals by performing thereon an operation equivalent to adding the offset ΔM to the amplitude compensation value.

Further, in the operation 502, although an average of the amplitude compensation value corresponding to the respective input level is obtained and used in the above description, it is more preferable to obtain and use a weighted average of the amplitude compensation value weighted by the occurrence frequency of the input level L for more definitely suppressing a change in the average input level of the amplifying unit. The occurrence frequency is detected by counting the number of occurrences of the respective input level for a preset amount of time by using a counter. Further, instead of counting the number of occurrences with respect to every input level, it is also possible to combine a number of consecutive values of the input level as an input level range and count the number of occurrences with respect to every input level range. Thus, the weighted average can be obtained approximately in a more simplified manner. Further, if CCDF (Complementary Cumulative Distribution Function) of the input signal can be approximately estimated, it is also possible to assign the weights based thereon in a stepwise manner (like 1, 0.5, 0.25, . . . , for example).

In a next operation 506, it is determined whether or not the detected distortion is reduced after the perturbation is applied. Then, if the distortion is reduced, the process moves on to a final operation 508. Otherwise, an operation 507 is performed to obtain the perturbation to be added to the above-described one of the coefficients by inverting the sign of the perturbation added to the above-described one of the coefficients.

In the final operation 508, it is determined whether the detected distortion is below or equal to a preset level (target value). Then, if the detected distortion is below or equal to the preset level, no more perturbation needs to be applied. Therefore, the process moves on to the operation 505 for detecting the residual distortion. Otherwise, the process moves on to the operation 501 for updating another of the coefficients, so that a perturbation is added to that coefficient. Further, instead of updating the coefficients for applying the perturbation whenever the process moves on to the operation 501, it is possible to update one of the coefficients a preset number of times (e.g., 10 times) consecutively.

As described above, the offset addition for stabilizing the amplitude of the distortion compensation value is repeated whenever the table is updated.

Figure 6:
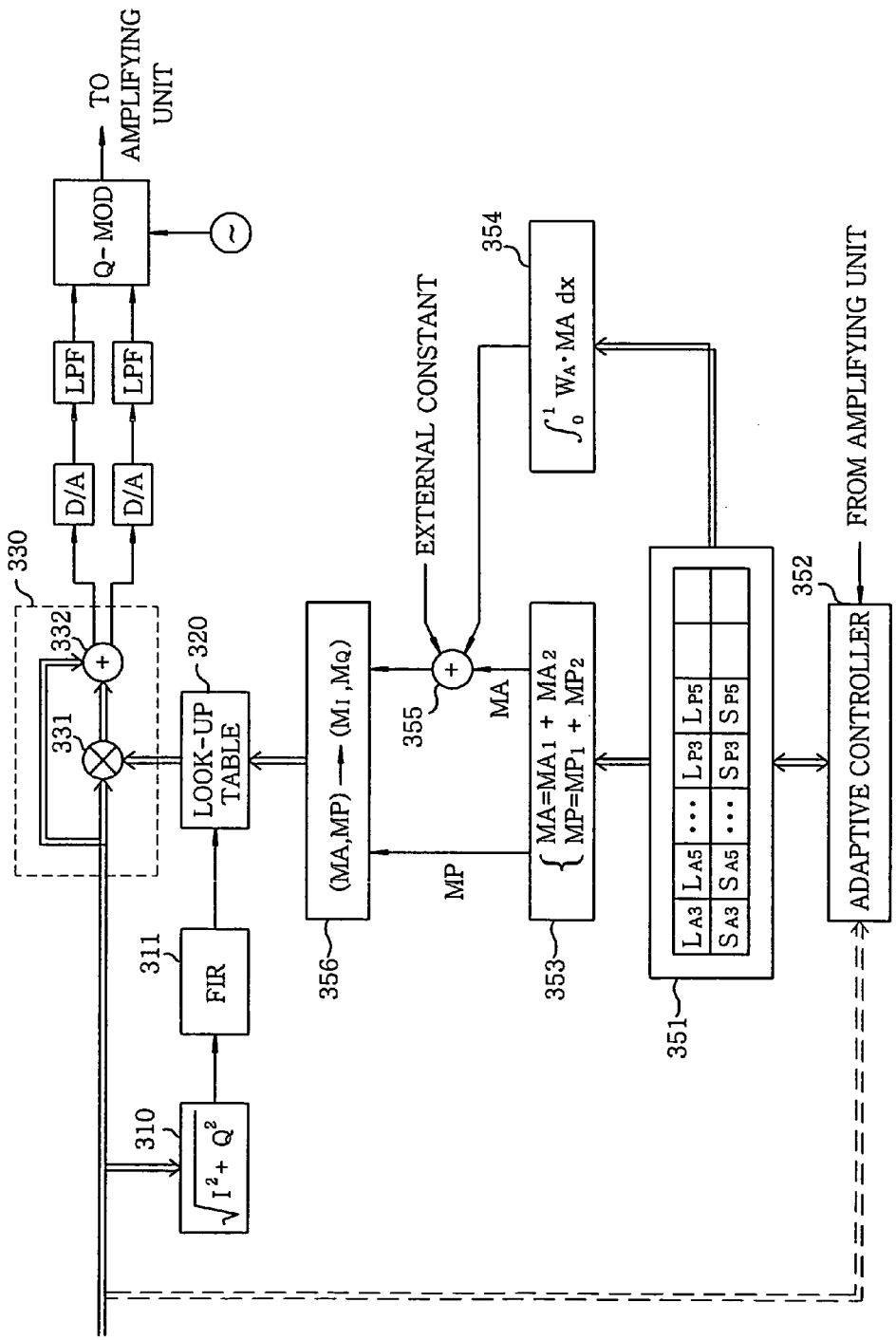
FIG. 6 sets forth a configuration diagram in accordance with a second preferred embodiment of the present invention.

FIG. 6 sets forth a configuration diagram in accordance with a second preferred embodiment of the present invention. In the second preferred embodiment of the present invention, a predistortion is performed on digital I and Q signals. Further, unlike the first preferred embodiment in which the offset is added to a distortion compensation value after it has been read out from the distortion compensation table, an offset is added at a time when a distortion compensation value is written into a distortion compensation table in accordance with the second preferred embodiment of the present invention.

An amplitude detection unit 310, whose function corresponds to the power detection unit 101, calculates a square root of a sum of squares of instantaneous amplitudes of I and Q components in an input signal $S_{IN}$ to output an instantaneous amplitude.

A FIR (Finite Impulse Response) filter 311 receives the instantaneous amplitude, and applies a frequency characteristic thereto to output an amplitude level. Alternatively, the FIR filter 311 may be omitted.

A look-up table 320, whose function corresponds to the distortion compensation table 102, stores distortion compensation values $M_I$ and $M_Q$ based on the input level outputted from the FIR filter 311, wherein $M_I$ and $M_Q$ indicate an I-phase and a Q-phase compensation value, respectively.

A predistortion unit 330, whose function corresponds to the predistortion unit 103, multiplies the distortion compensation value read out from the look-up table 1320 with the input signal at a time corresponding to the distortion compensation value, and adds the multiplied result to the input signal. The predistortion unit 330 includes a multiplier 331 for multiplying the input signal $S_{IN}$ with a complex compensation value obtained by the compensation values $M_I$ and $M_Q$ read out from the look-up table 320 to output a predistorted signal; and an adder 332 for adding the input signal $S_{IN}$ to the predistorted signal. The adder 332 can be omitted if the external constant approximates to 1.

A coefficient table 351 stores coefficients of respective terms of the above-described Taylor series. An adaptive control unit 352 updates the coefficients stored in the coefficient table 351 by using, e.g., the perturbation method, in such a manner that a residual distortion and an adjacent channel leakage power are reduced, thereby optimizing the coefficients.

A polynomial calculator 353 computes Eqs. 1 to 3 by referring to the coefficients stored in the coefficient table 351, thereby outputting the compensation values MA and MP corresponding to the respective input level.

A definite integral calculator 354 stores a primitive function obtained by multiplying the amplitude compensation value MA in Eq. 1 with a weighting function, and combines therewith the coefficients stored in the coefficient table 351 to compute a definite integral of MA in a range $0 \leq x \leq 1$. The weighting function is preferably a polynomial function, whose integration is simple. An example of the weighting function is presented in Eq. 4, wherein $w_{A1}$ and $w_{A2}$ are constants for approximating an occurrence probability of the respective input level.

$$W_A = w_{A1}(w_{A2}+x)(1-x)^3 \qquad \text{Eq. 4}$$

The offset adder 355 adds the integrated value outputted from the definite integral calculator 354 as well as an external constant to the compensation value MA outputted from the polynomial calculator 353. The external constant is used for performing a fine adjustment reflecting a small change in the amplifying unit caused by, e.g., a bias control, and can be controlled adaptively. However, it is possible to omit the external constant.

A coordinate converter 356 receives the amplitude compensation value MA outputted from the offset adder and the phase compensation value MP outputted from the polynomial calculator 353, and converts the coordinate representation thereof from a polar coordinate to a Cartesian coordinate to stores the converted values into the look-up table 320 as the I-phase and Q-phase compensation values $M_I$ and $M_Q$.

The coefficient table 351 to the coordinate converter 356 have a function corresponding to the control unit 106 in the first preferred embodiment.

In accordance with the second preferred embodiment, the calculation of the integral of the primitive function obtained by multiplying the amplitude compensation value MA in Eq. 1 with the weighting function in the range $0 \leq x \leq 1$ can be easily performed by only using the updated coefficients and the value of the integral function at x=1, thereby making it possible to reduce a memory capacity used for the calculation of the integral and enhance a speed of the calculation. Further, since a change in the gain is suppressed before and after the look-up table 320, it is possible to more precisely determine whether or not the coefficients are properly updated. In addition, by using a feedback control of the average value of the output of the amplifying unit, the adaptive control unit 352 can optimize the coefficients more quickly.

A change in the amplifying unit output level is caused by the amplitude compensation value assigned to the input signal by the predistortion unit. Therefore, the change in the amplifying unit output level can be suppressed by performing the predistortion by subtracting an average of the amplitude compensation value or a weighted average thereof based on an occurrence frequency of the input level from an amplitude compensation value corresponding to the respective input level.

While the invention has been shown and described with respect to the preferred embodiments, it will be understood by those skilled in the art that various changes and modification may be made without departing from the scope of the invention as defined in the following claims.

What is claimed is:

1. A predistortion amplifier for compensating distortion, comprising:
    an amplifying unit;
    a power detection unit for detecting an electric power or amplitude of an input signal to output an input level;
    a distortion compensation table for storing compensation values corresponding to the input level, the compensation values being used for compensating nonlinear characteristics of the amplifying unit;
    a control unit for updating the compensation values so that signal components outside of a desired frequency range that are included in an output signal of the amplifying unit do not exceed a preset level;
    a predistortion unit for generating a predistorted signal to be inputted to the amplifying device by performing a predistortion on the amplitude and a phase of the input signal, the predistortion being performed by using the compensation values corresponding to the input level outputted from the power detection unit stored in the distortion compensation table; and
    an offset adder for adding an offset value to an amplitude compensating value, the amplitude compensating value being assigned to the amplitude of the input signal by the compensation values based on the input level, and the offset value being determined regardless of the input level,
    wherein the control unit includes an offset generator for calculating an average value of the amplitude compensating value for each input level when the compensation values are updated, thereby generating the offset value by inverting a sign of the average value.

2. A predistortion amplifier for compensating distortion, comprising:
    an amplifying unit;
    a power detection unit for detecting an electric power or an amplitude of an input signal or a logarithm of the electric power or the amplitude thereof, thereby outputting an input level;
    a distortion compensation table for storing a complex compensation value corresponding to the input level, the complex compensation value being used for compensating nonlinear characteristics of the amplifying unit;
    a control unit for updating the complex compensation value so that signal components outside of a desired frequency range that are included in an output signal of the amplifying unit do not exceed a preset level;
    a predistortion unit for generating a predistorted signal to be inputted to the amplifying device by multiplying the input signal with the complex compensation value corresponding to the input level outputted from the power detection unit stored in the distortion compensation table, and then performing a predistortion on the amplitude and a phase of the input signal;
    an offset adder for adding an offset value to an amplitude compensating value, the amplitude compensating value being assigned to the amplitude of the input signal by the complex compensation value based on the input level, and the offset value being determined regardless of the input level;
    a counter for counting the number of occurrences of each input level for a preset amount of time; and
    an offset generator for calculating a weighted average value of the amplitude compensating value for each input level when the compensation values are updated to generate the offset value by inverting a sign of the weighted average value, each weight of the weighted average value being the number of the occurrences of each input level counted by the counter.

3. A predistortion amplifier for compensating distortion, comprising:
    an amplifying unit;
    a power detection unit for detecting an amplitude of an input signal to output an input level;
    a distortion compensation signal generation unit for generating a compensation signal based on the input level, the compensation signal being used for compensating nonlinear characteristics of the amplifying unit;
    a distortion compensation unit for performing a distortion compensation on the input signal by using the compensation signal to output a compensated signal to the amplifying unit;
    a control unit for controlling the distortion compensation signal generation unit to suppress a distortion in an output signal of the amplifying unit,
    wherein, in the distortion compensation signal generation unit, an amplitude component of the compensation signal is represented by a sum of a plurality of Taylor series including only odd or even power terms that allow the distortion compensation unit to mainly generate components of odd powers, each of the Taylor series being a finite polynomial function of the input level whose degree is 4 or higher computed about a plurality of central points in a range of the input level, and
    wherein the control unit controls coefficients of respective terms in the plurality of the Taylor series.

4. The predistortion amplifier of claim 3, wherein at least one of the plurality of Taylor series is substituted by 0 when the input level is the central point in at least one of the plurality of the Taylor series.

5. The predistortion amplifier of claim 3, wherein the amplifying unit is operated in class B or in class AB that is closer to class B, and a distortion is generated when the input level is smaller than a deviation of a bias level of the amplifying unit from a class-B level.

* * * * *